United States Patent
Gong et al.

(10) Patent No.: US 10,128,201 B2
(45) Date of Patent: Nov. 13, 2018

(54) SEAL RING FOR WAFER LEVEL PACKAGE

(71) Applicant: GLOBALFOUNDRIES Singapore Pte. Ltd., Singapore (SG)

(72) Inventors: Shunqiang Gong, Singapore (SG); Juan Boon Tan, Singapore (SG); Shan Gao, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/434,076

(22) Filed: Feb. 16, 2017

(65) Prior Publication Data

US 2018/0233462 A1 Aug. 16, 2018

(51) Int. Cl.
| | |
|---|---|
| *H01L 23/58* | (2006.01) |
| *H01L 23/31* | (2006.01) |
| *H01L 23/52* | (2006.01) |
| *H01L 21/768* | (2006.01) |
| *H01L 21/56* | (2006.01) |
| *H01L 23/528* | (2006.01) |
| *H01L 23/522* | (2006.01) |
| *H01L 23/00* | (2006.01) |

(52) U.S. Cl.
CPC .......... *H01L 23/585* (2013.01); *H01L 21/565* (2013.01); *H01L 21/76895* (2013.01); *H01L 23/3114* (2013.01); *H01L 23/528* (2013.01); *H01L 23/5226* (2013.01); *H01L 24/19* (2013.01); *H01L 24/20* (2013.01); *H01L 2224/0231* (2013.01); *H01L 2224/0239* (2013.01); *H01L 2224/02379* (2013.01); *H01L 2224/12105* (2013.01); *H01L 2224/13023* (2013.01); *H01L 2224/13024* (2013.01); *H01L 2224/211* (2013.01); *H01L 2924/01022* (2013.01); *H01L 2924/01029* (2013.01); *H01L 2924/01073* (2013.01); *H01L 2924/04941* (2013.01); *H01L 2924/04953* (2013.01); *H01L 2924/35* (2013.01); *H01L 2924/351* (2013.01); *H01L 2924/35121* (2013.01)

(58) Field of Classification Search
CPC ....... H01L 23/585; H01L 24/20; H01L 24/19; H01L 21/76895; H01L 21/565; H01L 23/528; H01L 23/3114; H01L 2224/023; H01L 2224/0231; H01L 2224/02315; H01L 2224/0233; H01L 2224/02373; H01L 2224/05008; H01L 2224/05548; H01L 2224/02379; H01L 2224/25171; H01L 2224/40108; H01L 2224/41171; H01L 2224/41173; H01L 2224/481
See application file for complete search history.

(56) References Cited

U.S. PATENT DOCUMENTS

| | | | |
|---|---|---|---|
| 2004/0150070 A1 | 8/2004 | Okada et al. | |
| 2010/0078769 A1 | 4/2010 | West et al. | |
| 2012/0286397 A1* | 11/2012 | Kuechenmeister | ... H01L 23/562 257/620 |
| 2016/0013124 A1* | 1/2016 | Chen | ....... H01L 21/78 257/774 |

(Continued)

*Primary Examiner* — Thanhha Pham
(74) *Attorney, Agent, or Firm* — Horizon IP Pte Ltd.

(57) ABSTRACT

Devices and methods for forming a device are disclosed. At least one die is provided. A redistribution layer having a fan-out region extends concentrically outwards from an outer perimeter of the at least one die. A seal ring is disposed in the fan-out region of the redistribution layer.

20 Claims, 4 Drawing Sheets

(56) References Cited

U.S. PATENT DOCUMENTS

2016/0043047 A1   2/2016  Shim et al.
2017/0103951 A1*  4/2017  Lee .................... H01L 21/4857
2017/0228529 A1*  8/2017  Huang .................. G06F 21/32

* cited by examiner

SEAL RING FOR WAFER LEVEL PACKAGE

BACKGROUND

Wafer level packaging (WLP) is the technology of packing an integrated circuit (IC) at wafer level, resulting in a device substantially having the size of the die. The traditional WLP technology includes the Fan-In WLP (FIWLP) technology which forms a dense peripheral array of contact pads at the edge of the chip and a redistribution layer (RDL) is added to route connection/circuit traces to a less dense area array. However, due to the configuration of inputs/outputs (I/Os) which are limited to the surface of the die, FIWLP packages are limited to low-end semiconductor devices, e.g., devices requiring less than 300 I/Os.

Fan-out WLP (FOWLP) technology, such as the Embedded Wafer Level Ball Grid Array (eWLB), is an enhancement of the FIWLP technology that provides a solution for semiconductor devices requiring a greater number of I/Os and a higher level integration. For example, FOWLP technology selects pre-diced known good dies (KGDs), reconstitutes the KGDs using am epoxy mould compound (EMC) into a wafer or panel for providing additional space for interconnects and adds a fan-out redistribution layer (RDL) having a dielectric layer and copper interconnects. Any number of additional interconnects can be realized on the package in an arbitrary distance (i.e., a fan-out design) as opposed to FIWLP, where the chip area would not be sufficient to place the required number of interconnects at a suitable distance.

In order to meet electrical performance requirements of semiconductor devices, the RDL is constructed using low-k or ultra low-k dielectric materials along with copper interconnects. However, such a material choice inevitably deteriorates the mechanical strength of the package, causing chip package interaction (CPI) reliability issues. Examples of CPI reliability issues include delamination from die corners and crack propagation from the area where dicing tool cuts the wafer into the active chip areas.

Therefore, it is desirable to provide simplified and cost efficient techniques for mitigating the CPI reliability issues.

SUMMARY

Embodiments generally relate to semiconductor devices and methods of forming a semiconductor device. In one embodiment, a semiconductor device is presented. The semiconductor device includes at least one die. A redistribution layer having a fan-out region extends concentrically outwards from an outer perimeter of the at least one die. A seal ring is disposed in the fan-out region of the redistribution layer.

In one embodiment, a device is disclosed. The device includes a mould compound having a first side and an opposing second side. At least one die is embedded in the mould compound. An active surface of the die is exposed on the second side of the mould compound. A redistribution layer (RDL) is disposed on the second side of the mould compound. The RDL has a fan-out region extending concentrically outwards from outer edges of the at least one die. A seal ring is disposed in the fan-out region of the RDL.

In another embodiment, a method for forming a device is disclosed. The method includes forming a mould compound embedding at least one die. The mould compound includes a first surface and an opposing second surface. A redistribution layer (RDL) having a prime region and a fan-out region is formed over the second surface of the mould compound. The fan-out region extends concentrically outwards from outer edges of the at least one die and surrounds the prime region. Forming the RDL includes simultaneously forming RDL interconnects in the prime region and a seal ring in the fan-out region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which.

DETAILED DESCRIPTION

Embodiments generally relate to semiconductor packages. More particularly, embodiments relate to forming a seal ring around the peripheral of a semiconductor die of a Fan-out WLP (FOWLP), such as an Embedded Wafer Level Ball Grid Array (eWLB) package. The semiconductor packages can be incorporated into, for example, consumer electronic products, such as computers, cell phones, and personal digital assistants (PDAs). Incorporating the semiconductor packages in other applications may also be useful.

Figure 1:
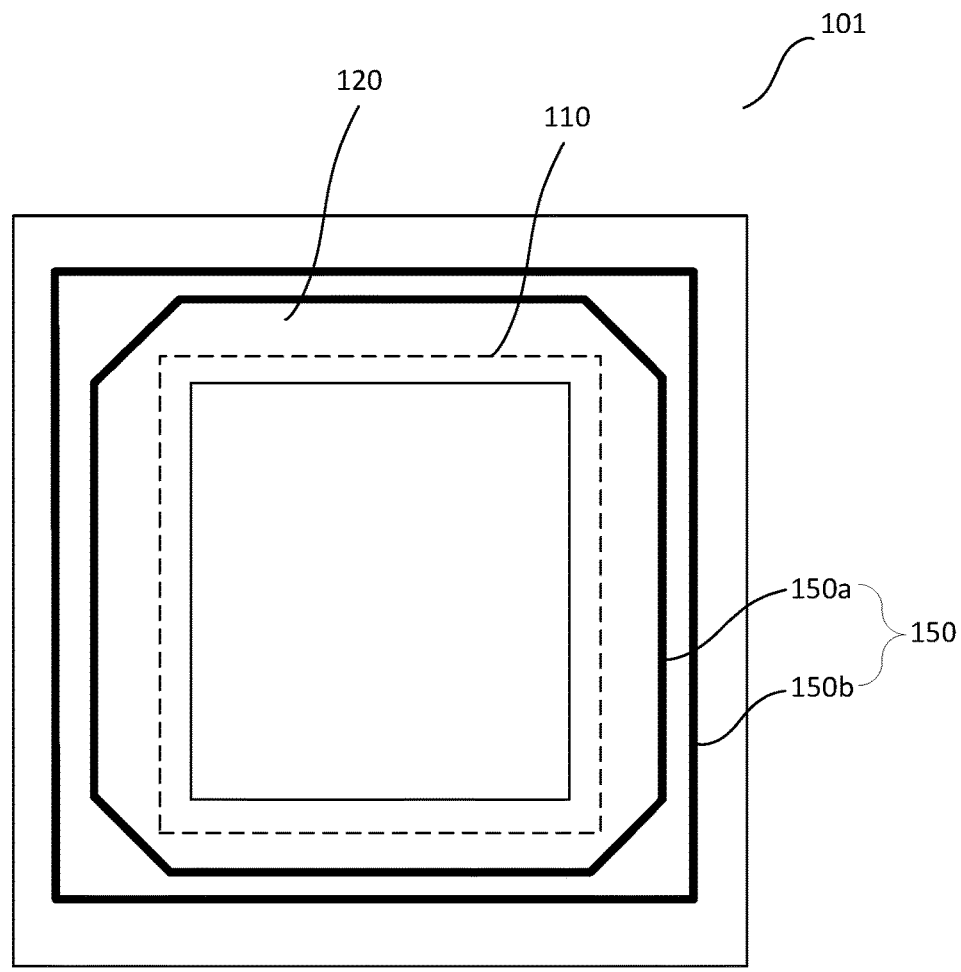
FIG. 1 shows an exemplary plan view of an Embedded Wafer Level Ball Grid Array (eWLB) package having a seal ring.

FIG. 1 shows a simplified top view 100 of a semiconductor device 101. A mold compound for embedding a die is omitted in the top view. In one embodiment, the device is a wafer-level package (WLP). For example, the WLP is a fan-out WLP (FOWLP), such as an eWLB. The semiconductor device 100 includes a main device region 110 (i.e., within the dotted square) and a frame or perimeter region 120 (i.e., between the dotted square and outer perimeter). The main device region includes one or more dies, features and interconnections of the die(s). As for the perimeter region, it surrounds the main device region. The perimeter region, for example, serves as dicing channels on the wafer, separating adjacent devices. The devices are singulated by dicing the wafer along the dicing channels.

Figure 2:
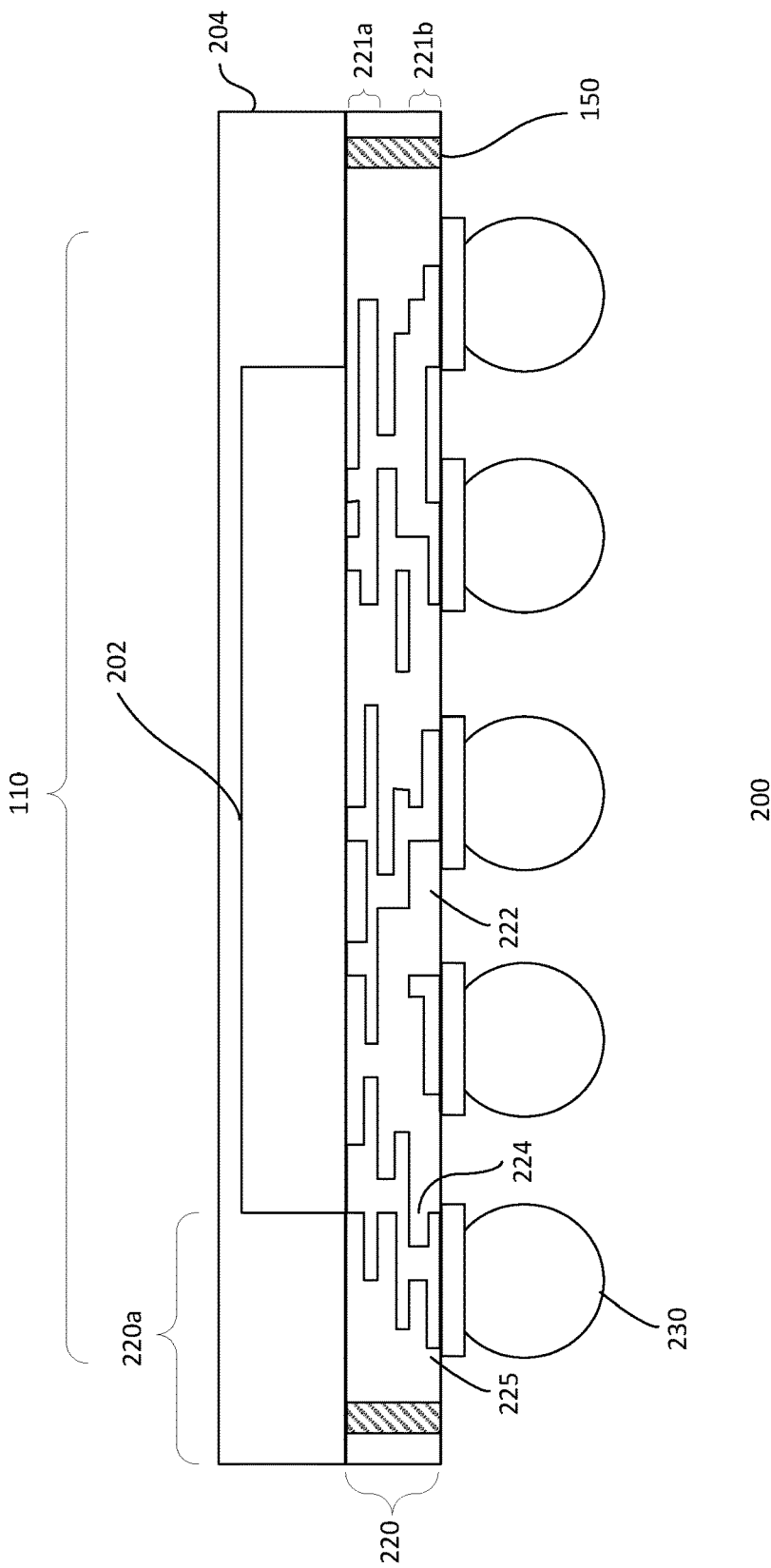
FIG. 2 shows an exemplary cross-sectional view of a eWLB package.

FIG. 2 shows a corresponding simplified cross-sectional view 200 of the semiconductor device 101. As shown, the main device region includes a die (or chip) 202 embedded in a mold compound 204. The die may be a radio frequency (RF) integrated circuit (IC), a memory IC or other types of IC. Although only one die is shown, the package may include multiple dies/chips placed side by side or vertically stacked, forming a high density FOWLP (HD-FOWLP).

The device 101 includes a pad layer (not shown). The pad layer may include a first surface facing an active surface of the die and a second surface facing a redistribution layer (RDL) 220. The pad layer may be a dielectric layer and include a plurality of conductive pillar. Each of the conductive pillar may be coupled to a contact pad disposed on the active surface of the die. The conductive pillar, for example, may be aluminium or copper. In one embodiment, a conductive barrier layer (not shown), such as a tantalum layer, may be provided between the active surface of the die and the first portion of the upper contact layer. Other conductive barrier layer, such as a TaN, Ti or TiN layer may also be useful.

The RDL 220 includes a plurality of RDL levels. The number of RDL levels may depend on, for example, design requirements. An RDL level, for example, includes a RDL dielectric layer 222 having a RDL via level 224 and a RDL line level 225. The RDL dielectric layer 222 may include silicon oxide or silicon nitride. Other suitable types of dielectric materials may also be useful. A line level of a RDL level may be referred to as $M_i$, where i is from 1 to x and is the $i^{th}$ RDL level of x RDL levels. A via level of a RDL level may be referred to as $V_{i-1}$, where i is the $i^{th}$ RDL level of x RDL levels and CA is commonly denoted as the first via level. Interconnects, such as contacts are provided for the RDL via level 224 and conductive lines are provided for the RDL line level 225. The contacts and conductive lines are, for example, copper contacts and conductive lines formed by a damascene or dual damascene technique. Other suitable techniques for forming the interconnects, such as the copper contacts and conductive lines, or configurations of RDL levels may also be useful. The interconnects of an uppermost RDL level 221a are connected to the conductive pillar (pillar), while the interconnects of a lowest most RDL level 221b are connected to contacts 230, such as solder bumps, via aluminum pads. A passivation layer (not shown) may be provided between the RDL and contacts.

The RDL layer 220, in one embodiment, is configured to extend beyond the outer edges of the die 202. For example, the RDL layer 220 includes a fan-out region 220a extending concentrically outwards from the outer perimeter of the die 202. For a high density fan-out (HD-FO) device having more than one die arranged side-by-side, the fan-out region extends concentrically outwards from the outer edges of the outermost dies. As shown in FIG. 2, the fan-out region 220a provides an additional re-routing area, allowing the copper interconnects and solder balls to be re-routed outside of the perimeter of the die.

Figure 3:
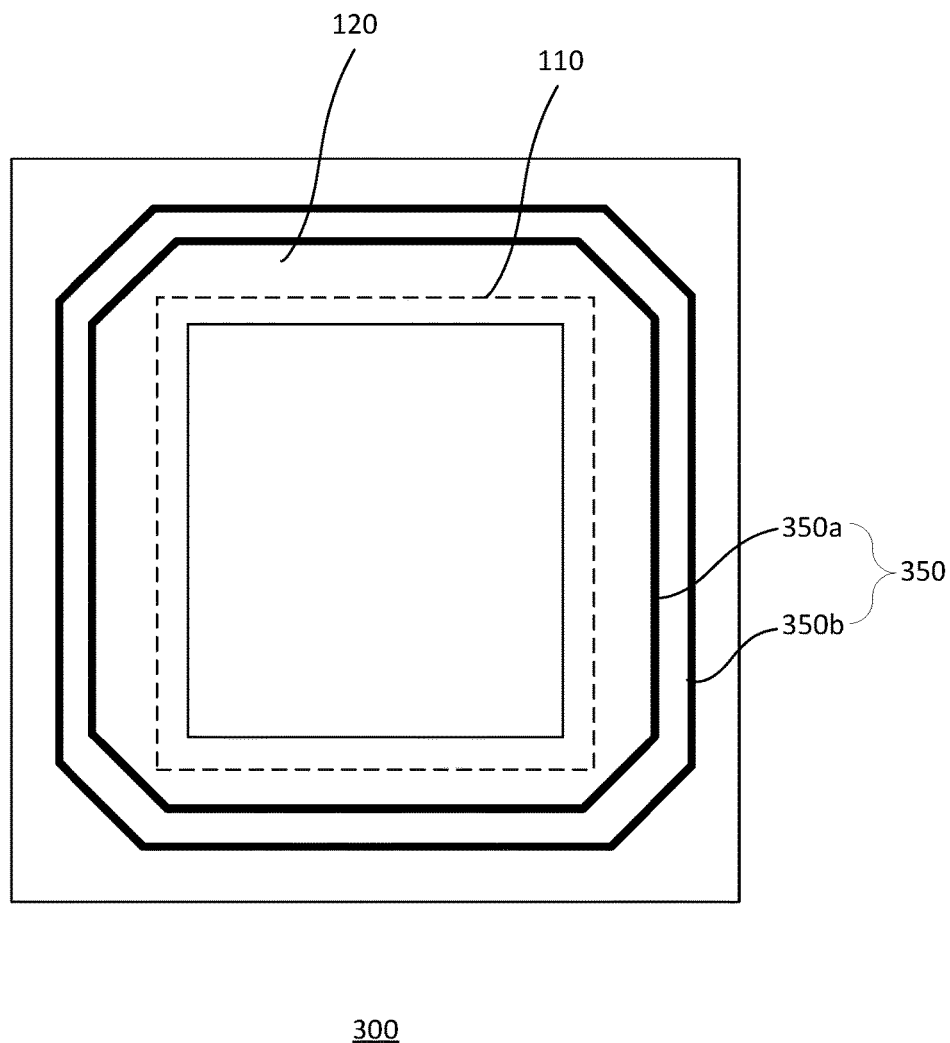
FIG. 3 shows another exemplary plan view of a semiconductor device.

A seal ring 150 is disposed in perimeter area 120 of the device 100. In one embodiment, the seal ring 150 is disposed in the fan-out region 220a of the RDL 220 between the die edge and saw kerf. The seal ring 150, as shown in FIG. 1, surrounds the main device area 110 and is parallel to the outer perimeter of the die. The seal ring, in one embodiment, includes a pair of seal rings, i.e., a first seal ring 150a and a second seal ring 150b. The pair of seal rings, for example, is arranged in parallel. The first seal ring 150a is an inner seal ring and the second seal ring 150b is an outer seal ring. The inner seal ring 150a is disposed between the die 220 and outer seal ring 150b. In one embodiment, the inner seal ring 150a is a line parallel to the perimeter of the die except at the corner area. The outer seal ring 150b is proximate to the saw kerf. The distance of the outer seal ring from the saw kerf is about 1 µm. As illustrated in FIG. 1, the inner seal ring 150a is configured to have a sloped or chamfered corner as opposed to the die which has a sharp corner, e.g., a 90 degree corner. The outer seal ring 150b is a line parallel to the perimeter of the die, including the sharp corners. In another embodiment 300 as illustrated in FIG. 3, the outer seal ring 350b is configured in the same way as the inner seal ring 350a. For example, sloped or chamfered corners are provided for the outer seal ring 350b, such that the outer seal ring 350b is a line parallel to the inner seal ring 350a. Providing a seal ring having other configurations may also be useful. In one embodiment, the distance of the seal ring (i.e., the inner seal ring) from the die edge is determined by the process tolerance, i.e., an assembly isolation. The assembly isolation ensures that the seal ring does not interfere the die edge. The distance, for example, is about 1-2 µm.

Figure 4:
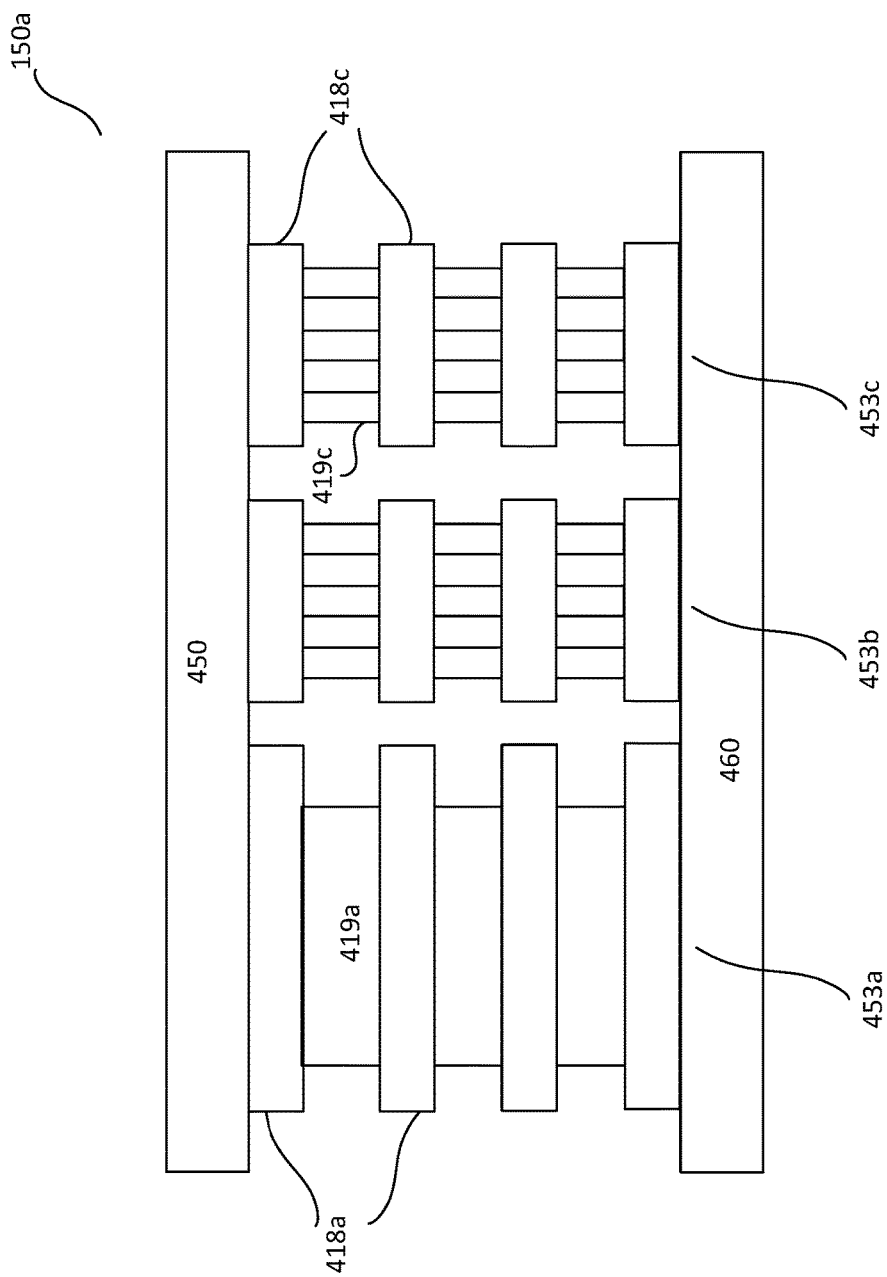
FIG. 4 show an exemplary cross-sectional view of a seal ring.

The seal ring, for example, includes trenches connected by vias, forming a continuous metal structure. In one embodiment, the seal ring may include a plurality of continuous metal structures disposed in parallel. FIG. 4 shows an exemplary cross-sectional view 400 of an inner seal ring of 150a of the seal ring 150 disposed between a pad layer 450 and a passivation layer 460. As shown, the inner seal ring 150a includes three continuous metal structures (453a-c) disposed in parallel. An innermost metal structure 453c is proximate to the die edge, whereas the outermost metal structure 453a is proximate to the outer seal ring. In one embodiment, adjacent trenches 418a of the outermost metal structure 453a are connected by a via 419a, whereas adjacent trenches 418c of the innermost metal structure 453c are connected by a plurality of vias 419c. The metal structure disposed in between the outermost and innermost metal structures may have the configuration of either the outermost or innermost metal structure. In one embodiment, the outer seal ring of the seal ring 150 may have the same configuration as the inner seal ring shown in FIG. 4. Alternatively, the outer seal ring may have a different configuration than the inner seal ring, such as having less or more than three metal structures.

In one embodiment, the metal structures have the same number of metal levels. The number of metal level of the metal structures corresponds to the number of RDL levels. For example, vias of the metal structures are disposed in the RDL via levels and trenches of the metal structures are disposed in the RDL line levels. The metal structures are formed of a conductive material of the interconnects disposed in the RDL. For example, the metal structures and interconnects in the same RDL level are simultaneously formed in the same process using a damascene or dual damascene technique. Damascene technique includes forming openings in a RDL dielectric layer which are filled with a conductive material. Excess conductive material is removed by, for example, polishing. This forms vias or trenches in the via or line level. Dual damascene technique includes forming in the RDL dielectric layer openings corresponding to via openings and openings corresponding to trenches, which are filled by a conductive material. Excess conductive material is removed by, for example, polishing. This forms vias and trenches in a single process.

In one embodiment, the seal ring 150 and die 202 of FIG. 2 are coupled to the same ground. For example, the inner seal ring, outer seal ring and die are coupled to the same ground. If there are more than one die in the semiconductor device 101, all the dies are coupled to the same ground as the seal ring. In one embodiment, a die seal (not shown) is provided for the die 202. The die seal, for example, is disposed in a peripheral area of the die, surrounding a functional area of the die. The die seal are protection structures which protects the internal circuit inside the die from damage caused by dicing or sawing the die from a wafer. The die seal is typically formed of metal lines and connecting conductive vias. In one embodiment, the die seal, seal ring and the die are coupled to the same ground. Such grounding of the seal ring and die is essential for draining away ionic contaminations incurred during the process of joining various parts (e.g., bonding of the dies), thus preventing radio frequency interference.

The semiconductor device 101 as shown in FIG. 2 may be fabricated using either the RDL-first method of chip-first method which are known in the art. The RDL-first method typically commences with applying a release layer on a carrier, forming a RDL layer including a seal ring over the release layer, assembling dies (or chips) on a first side of the RDL layer, reconstituting the dies with an epoxy mould compound to form a wafer, releasing the carrier from the wafer, forming solder bumps on a second side of the RDL layer and finally singulating the wafer to form individual semiconductor packages (devices). On the other hand, the chip-first method typically starts with applying a thermal release layer on a carrier, assembling dies on the carrier, reconstituting the dies with an epoxy mould compound to form a wafer, releasing the wafer from the carrier, forming RDL layer having a first side over an active surface of the dies, the RDL layer includes a seal ring, forming solder bumps on a second side of the RDL layer and finally singulating the wafer to form individual semiconductor packages (devices).

Regardless of the fabrication method, the seal ring as described with respect to FIGS. 1 to 4 can be formed simultaneously with the RDL interconnects during the formation of the RDL layer without any additional process steps or lithography mask layers. Therefore, the devices as described do not incur additional process steps and the method of fabrication of such is highly compatible and can be integrated with existing manufacturing process. Furthermore, there is no need to provide extra space for accommodating the seal ring, since the seal ring is disposed in the fan-out region of the device. The presence of the seal ring which envelopes the die area prevents crack propagation and edge delamination during singulation process, thus eliminating chip package interaction (CPI) reliability issues.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor device comprising:
   a die;
   a redistribution layer (RDL) having first and second major surfaces, wherein the first major surface includes a die region on which the die is disposed, the RDL comprises a fan-out region which includes metal lines and contacts interconnected to the die; and
   a seal ring disposed in the RDL surrounding the fan-out region, wherein the seal ring comprises first and second distinct concentric seal rings surrounding the fan-out region of the RDL, the first seal ring is proximate to the fan-out region and the second seal ring is proximate to a kerf region of the device, wherein a second seal ring width W2 of the second seal ring is larger than a first seal ring width W1 of the first seal ring, the first seal ring comprises chamfered corners.

2. The semiconductor device of claim 1 wherein the die is embedded in a mould compound.

3. The semiconductor device of claim 2 wherein the mould compound comprises a first side and an opposing second side; and
   an active surface of the die is exposed on the second side of the mould compound.

4. The semiconductor device of claim 3 wherein the seal ring comprises a third distinct concentric seal ring, the third distinct concentric seal ring is disposed proximate to the first seal ring, where W2 is wider than a third seal ring width W3 of the third seal ring.

5. The semiconductor device of claim 4 wherein the third seal ring comprises chamfered corners.

6. The semiconductor device of claim 4 wherein the first, second and third seal rings each comprises a continuous metal structure.

7. The semiconductor device of claim 3 wherein the second seal ring comprises chamfered corners.

8. The semiconductor device of claim 3 wherein the second and third seal rings comprise chamfered corners.

9. The semiconductor device of claim 1 wherein the RDL comprises a plurality of RDL levels, and wherein an RDL level comprises a RDL dielectric layer having a RDL via level and a RDL line level.

10. The semiconductor device of claim 1 wherein the seal ring comprises a third distinct concentric seal ring, the third seal ring is disposed between the first and second seal rings, where W2 is wider than a third seal ring width W3 of the third seal ring.

11. The semiconductor device of claim 10 wherein the third seal ring comprises chamfered corners.

12. The semiconductor device of claim 10 wherein the second seal ring comprises chamfered corners.

13. The semiconductor device of claim 10 wherein:
    the second seal ring comprises chamfered corners; and
    the third seal ring comprises chamfered corners.

14. The semiconductor device of claim 1 wherein the second seal ring comprises chamfered corners.

15. The semiconductor device of claim 1 wherein the first and second seal rings each comprises a continuous metal structure, wherein the metal structures of the first and second seal rings are arranged in parallel, and wherein each of the metal structure comprises a stack of alternately arranged trenches and vias.

16. The semiconductor device of claim 1 wherein:
    each of the first and second seal rings comprises a metal structure having a plurality of metal levels;
    the RDL comprises a plurality of RDL levels; and
    the plurality of metal levels correspond to the plurality of RDL levels.

17. The semiconductor device of claim 16 wherein the second seal ring comprises chamfered corners.

18. The semiconductor device of claim 1 wherein the die and the seal ring are coupled to a same ground.

19. A semiconductor device comprising:
    a die;
    a redistribution layer (RDL) comprising a fan-out region extending concentrically outwards from an outer perimeter of the die; and
    a seal ring disposed in the RDL surrounding the fan-out region, wherein the seal ring comprises an inner seal ring and an outer seal ring arranged in parallel, and wherein the inner and outer seal rings comprise chamfered corners.

20. A device comprising:
    at least one die;

a redistribution layer (RDL) comprising a fan-out region extending from an outer perimeter of the at least one die; and a seal ring disposed in the RDL surrounding the fan-out region, wherein the seal ring comprises first and second distinct concentric ring structures, wherein each ring structure comprises a continuous metal structure with chamfered corners.

* * * * *